United States Patent
Ye et al.

(10) Patent No.: US 8,454,804 B2
(45) Date of Patent: *Jun. 4, 2013

(54) PROTECTIVE OFFSET SPUTTERING

(75) Inventors: Mengqi Ye, San Jose, CA (US);
Zhendong Liu, San Jose, CA (US);
Peijun Ding, Saratoga, CA (US)

(73) Assignee: Applied Materials Inc., Santa Clara, CA (US)

( * ) Notice: Subject to any disclaimer, the term of this patent is extended or adjusted under 35 U.S.C. 154(b) by 833 days.

This patent is subject to a terminal disclaimer.

(21) Appl. No.: 11/262,193

(22) Filed: Oct. 28, 2005

(65) Prior Publication Data
US 2007/0095650 A1    May 3, 2007

(51) Int. Cl.
*C23C 14/35* (2006.01)

(52) U.S. Cl.
USPC ............ 204/192.12; 204/192.15; 204/192.17; 204/298.18; 204/298.19; 204/298.23; 204/298.28

(58) Field of Classification Search
USPC ............ 204/192.12, 192.15, 192.17, 298.07, 204/298.11, 298.2, 298.23, 298.28, 298.18, 204/298.19
See application file for complete search history.

(56) References Cited

U.S. PATENT DOCUMENTS

| | | |
|---|---|---|
| 4,756,810 A | 7/1988 | Lamont et al. |
| 5,180,708 A | 1/1993 | Harada et al. |
| 5,186,718 A | 2/1993 | Tepman et al. |
| 5,536,330 A | 7/1996 | Chen et al. |
| 5,665,214 A * | 9/1997 | Iturralde ................ 204/298.03 |
| 5,736,021 A | 4/1998 | Ding et al. |
| 5,759,287 A | 6/1998 | Chen et al. |
| 5,770,025 A * | 6/1998 | Kiyota ..................... 204/298.2 |
| 5,885,750 A * | 3/1999 | Hsiao et al. .................. 430/314 |
| 5,937,303 A * | 8/1999 | Gardner et al. ............... 438/305 |
| 6,183,614 B1 | 2/2001 | Fu |
| 6,241,857 B1 * | 6/2001 | Yamada .................. 204/192.12 |
| 6,258,707 B1 | 7/2001 | Uzoh |
| 6,277,722 B1 | 8/2001 | Lee et al. |
| 6,306,265 B1 * | 10/2001 | Fu et al. ................... 204/192.12 |
| 6,413,382 B1 | 7/2002 | Wang et al. |
| 6,454,914 B1 | 9/2002 | Nakamura |
| 6,503,050 B2 | 1/2003 | Reimer et al. |
| 6,538,327 B1 | 3/2003 | Lopatin et al. |
| 6,641,701 B1 | 11/2003 | Tepman |
| 6,833,161 B2 | 12/2004 | Wang et al. |

(Continued)

FOREIGN PATENT DOCUMENTS

| | | |
|---|---|---|
| TW | 517175 | 1/2003 |
| WO | 2007053317 | 5/2007 |

OTHER PUBLICATIONS

PCTUS2006040822 International Search Report and Written Opinion dated Aug. 2, 2007.

(Continued)

*Primary Examiner* — Rodney McDonald
(74) *Attorney, Agent, or Firm* — Konrad Raynes Davda & Victor LLP

(57) ABSTRACT

Sputtering in a physical vapor deposition (PVD) chamber may, in one embodiment, utilize a target laterally offset from and tilted with respect to the substrate. In another aspect, target power may be reduced to enhance film protection. In yet another aspect, magnetron magnets may be relatively strong and well balanced to enhance film protection. In another aspect, a shutter may be provided to protect the substrate in start up conditions. Other embodiments are described and claimed.

9 Claims, 4 Drawing Sheets

U.S. PATENT DOCUMENTS

| | | | |
|---|---|---|---|
| 6,844,119 | B2 | 1/2005 | Nozawa et al. |
| 6,878,243 | B2 * | 4/2005 | Breme .................. 204/192.23 |
| 6,899,795 | B1 * | 5/2005 | Dubs et al. .............. 204/192.12 |
| 6,916,398 | B2 | 7/2005 | Chen et al. |
| 6,946,408 | B2 | 9/2005 | Le et al. |
| 7,141,186 | B2 | 11/2006 | Abe et al. |
| 7,775,158 | B2 | 8/2010 | Ando |
| 7,884,032 | B2 | 2/2011 | Ye et al. |
| 2002/0046945 | A1 | 4/2002 | Hosokawa et al. |
| 2002/0086220 | A1 * | 7/2002 | Nozawa et al. ................ 430/5 |
| 2003/0121608 | A1 | 7/2003 | Chen et al. |
| 2003/0224217 | A1 | 12/2003 | Byun et al. |
| 2004/0113211 | A1 * | 6/2004 | Hung et al. ................. 257/407 |
| 2006/0096851 | A1 | 5/2006 | Lavitsky et al. |
| 2006/0096857 | A1 | 5/2006 | Lavitsky et al. |
| 2007/0095651 | A1 | 5/2007 | Ye et al. |
| 2007/0099438 | A1 | 5/2007 | Ye et al. |

OTHER PUBLICATIONS

International Preliminary Report on Patentability, May 8, 2008, for International Application No. PCT/US2006/040822, 10 pp.
Advisory Action for U.S. Appl. No. 11/389,610, dated May 1, 2008, 3 pp. [7828.7110P (AdvAct)].
Appeal Brief for U.S. Appl. No. 11/389,610, dated Oct. 26, 2009, 69 pp. [7828.7110P (AppealBrief)].
Appeal Decision for U.S. Appl. No. 11/389,610, dated Apr. 30, 2012, 10 pp. [7828.7110P (AppealDecision)].
Examiner's Answer for U.S. Appl. No. 11/389,610, dated Jan. 20, 2010, 46 pp. [7828.7110P (ExamAnswer)].
Final Office Action 1 for U.S. Appl. No. 11/389,610, dated Feb. 21, 2008, 28 pp. [7828.711OP (FOA1)].
Final Office Action 2 for U.S. Appl. No. 11/389,610, dated Apr. 22, 2009, 29 pp. [7828.711OP (FOA2)].
Notice of Allowance 1 for U.S. Appl. No. 11/389,610, dated Jul. 13, 2012, 7 pp. [7828.7110P (NOA1)].
Office Action 1 for TW Application No. 95139573, dated Oct. 12, 2011, 44 pp. (includes English Summary of Official Letter & English Translation of Search Report and Claims) [7828.7110TVV (OA1)].
Office Action 1 for U.S. Appl. No. 11/389,610, dated Jun. 25, 2007, 25 pp. [7828.711OP (OA1)].
Office Action 2 for TW Application No. 95139573, dated Aug. 31, 2012, 35 pp. (includes English Summary of Official Action & English Translation of Claims) [7828.7110TW (OA2)].
Office Action 3 for U.S. Appl. No. 11/389,610, dated Oct. 20, 2008, 29 pp. [7828.711OP (OA3)].
Reply Brief for U.S. Appl. No. 11/389,610, dated Mar. 19, 2010, 10 pp. [7828.711OP (ReplyBrief)].
Response to Final Office Action 1 for U.S. Appl. No. 11/389,610, dated Apr. 21, 2008, 16 pp. [7828.711OP (RFOA1-1)].
Response to Final Office Action 1 for U.S. Appl. No. 11/389,610, dated Sep. 23, 2008, 18 pp. [7828.711OP (RFOA1-2)].
Response to Office Action 1 for TW Application No. 95139573, dated Apr. 6, 2012, 37 pp. (Includes English Translation of Claims) [7828.7110TW (ROA1)].
Response to Office Action 1 for U.S. Appl. No. 11/389,610, dated Nov. 26, 2007, 16 pp. [7828.711OP (ROA1)].
Response to Office Action 3 for U.S. Appl. No. 11/389,610, dated Jan. 21, 2009, 18 pp. [7828.711OP (ROA3)].
Applied Materials, Inc., "Applied Centura Gate Stack", [online], 2005 [retrieved on Aug. 3, 2005], retrieved from the Internet at <URL: http://www.appliedmaterials.com/products/fep_centura-dpn.html>, 5 pp.
Applied Materials, Inc "Applied Materials Product Overview 2005—Dielectric Deposition", retrieved prior to Oct. 28, 2005, 11 pp.
Applied Materials, Inc., "Applied Producer Dielectric Etch", [online], 2005, [retrieved on Aug. 3, 2005], retrieved from the Internet at <URL: http://www.appliedmaterials.comlproducts/pro-ducer_etch.html>, 2 pp.
Lek, C.M., B.J. Cho, C.H.Ang, S.S. Tan, W.Y. Loh, J.Z. Zhen, and C. Lap, "Impact of Decoupled Plasma Nitridation of Ultra-Thin Gate Oxide on the Performance of P-Channel MOSFETs", Letter to the Editor, Semiconductor Science and Technology, No. 17, May 17, 2002, 4 pp.
Nano-Tsunami.Com, "Applied Materials and IMEC Collaborate to Develop 45nm Transistor Technologies", [online] Jan. 13, 2005, [retrieved on Aug. 3, 2005], retrieved from the Internet at <URL: http://www.voyle.net/Nano%20Electronics%202005/Nano%20Electronics-2005-0002.htm>, 3 pp.
Williams Advanced Materials, "MRAM Technology Reviews", [online], 2005, [retrieved Aug. 19, 2005], retrieved from the Internet at <URL: http://www.williams-adv.com/tools/mram-technology-re-view.php>, 2 pp.

* cited by examiner

PROTECTIVE OFFSET SPUTTERING

BACKGROUND

Physical vapor deposition (PVD), or sputtering, is one of the most commonly used processes in fabrication of integrated circuits and devices. PVD is a plasma process performed in a vacuum chamber where a negatively biased target (typically, a magnetron target) is exposed to a plasma of an inert gas having relatively heavy atoms (e.g., argon (Ar)) or a gas mixture comprising such inert gas. Bombardment of the target by ions of the inert gas results in ejection of atoms of the target material. The ejected atoms accumulate as a deposited film on a substrate placed on a substrate pedestal which generally faces the target.

DETAILED DESCRIPTION

Figure 1:
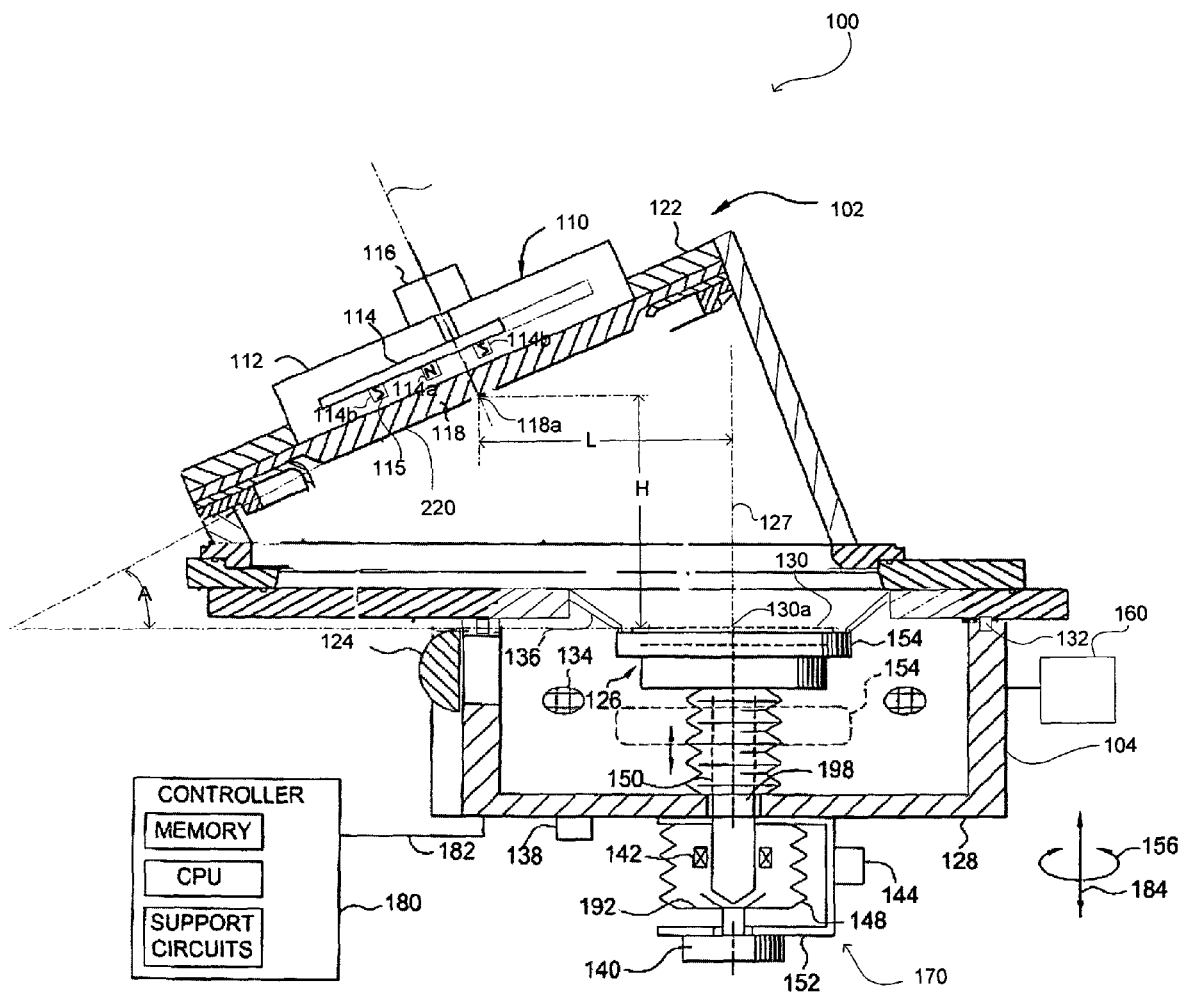
FIG. 1 is a schematic sectional view of one embodiment of a PVD chamber in accordance with the present description.

In the following description, reference is made to the accompanying drawings which form a part hereof and which illustrate several embodiments. It is understood that other embodiments may be utilized and structural and operational changes may be made without departing from the scope of the descriptions provided.

Copending application Ser. No. 10/984,265, filed Nov. 8, 2004, entitled "PHYSICAL VAPOR DEPOSITION CHAMBER HAVING A ROTATABLE SUBSTRATE PEDESTAL" and copending application Ser. No. 10/984,291, filed Nov. 8, 2004, entitled "PHYSICAL VAPOR DEPOSITION CHAMBER HAVING AN ADJUSTABLE TARGET" and assigned to the assignee of the present application, describe a PVD chamber for depositing highly uniform thin films. The chamber includes a rotatable substrate pedestal. In one embodiment, the pedestal, during a film deposition, rotates at an angular velocity of about 10 to 100 revolutions per minute (RPM). In further embodiments, one or more sputtering targets are movably disposed above the pedestal. The orientation of the targets relative to the pedestal may be adjusted laterally, vertically or angularly. In one embodiment, the target may be adjusted between angles of about 0 to about 45 degrees relative to an axis of pedestal rotation.

The trend of shrinking transistor sizes in integrated circuit (IC) manufacturing has often resulted in an associated shrinkage in the thickness of deposited layers. Such thin layers including thin dielectric layers or metal layers may be relatively susceptible to being damaged by the plasmas often associated with PVD sputtering. In accordance with one aspect of the present description, a PVD chamber is provided which can, it is believed, reduce the occurrence of plasma induced damage to thin dielectric or conductive layers during a PVD sputtering process. It is appreciated that in other applications, features other than the reduction or elimination of plasma induced damage may be utilized, depending upon the particular application.

A PVD chamber in accordance with one embodiment of the present description is indicated generally at 100. The PVD chamber 100 generally comprises a lid assembly 102, a main assembly 104, a motion control unit 170, support systems 160, and a controller 180. In one embodiment, the lid assembly 102 includes a target assembly 110 and an upper enclosure 122. The target assembly 110 includes a rotatable magnetron pack 114 disposed within a target base 112 (e.g., water-cooled base), and a target 118. The magnetron pack 114 is mechanically coupled to a drive 116 that, in operation, rotates the pack at a predetermined determined angular velocity about an axis 119. One magnetron pack that may be adapted to benefit from the invention is described in U.S. Pat. No. 6,641,701, issued Nov. 4, 2003 to A. Tepman, and is incorporated herein by reference in its entirety. The target assembly 110 is electrically coupled to a plasma power supply (not shown), such as an RF, DC, pulsed DC, and the like power supply.

In accordance with one aspect of the present description, the magnetron pack 114 includes relatively strong and relatively well balanced magnet poles 114a, 114b. As explained in greater detail below, such an arrangement can, it is believed, reduce ion induced damage to a thin film or other structure on a substrate 130.

Figure 3A:
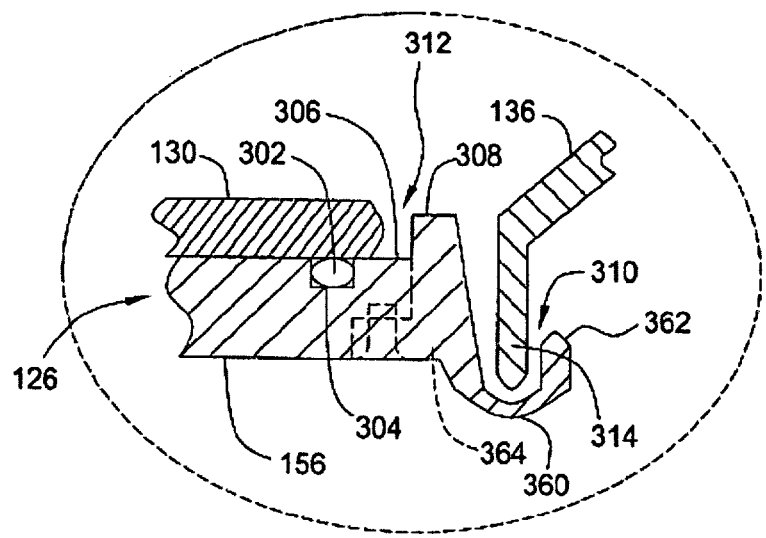
FIG. 3A is a partial cross-sectional view of the rotatable substrate pedestal of FIG. 1.
Figure 3B:
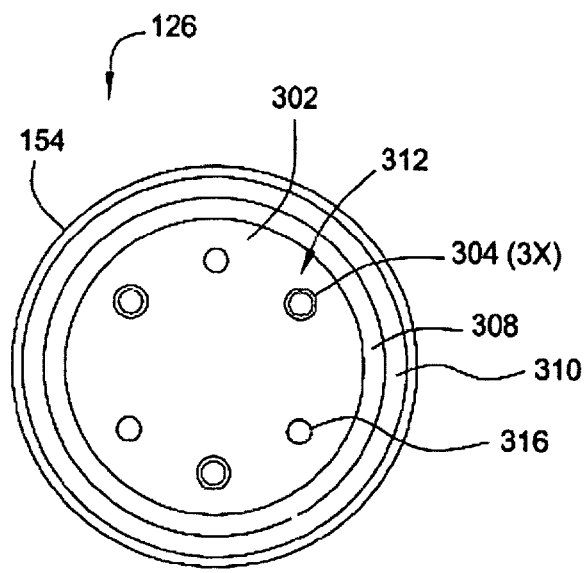
FIG. 3B is a top view of the substrate support pedestal of FIG. 1.

FIG. 1 depicts one embodiment of a PVD chamber 100 having a rotatable substrate pedestal 126. FIG. 3A depicts a partial cross-sectional view of the substrate pedestal 126. The cross-sectional view in FIG. 3A is taken along a radius of the substrate pedestal 126. The images in FIGS. 1, 3A and 3B are simplified for illustrative purposes and are not depicted to scale. For best understanding of this embodiment of the invention, the reader should refer simultaneously to FIGS. 1, 3A and 3B.

The pedestal 126 rotates about an axis 127 which, in the illustrated embodiment, passes through the center 130a of the substrate 130. It is appreciated that in other applications, the center 130a of the substrate 130 may be offset with respect to an axis of rotation of a rotatable pedestal. In the illustrated embodiment, the target 118 is tilted at an angle A with respect to the plane defined by the top surface of the substrate 130. It is believed that, rotation of the substrate 130 as target material is sputtered from the angled target 118 can increase the uniformity of thickness of deposition of sputtered target material onto the substrate 130.

In accordance with another aspect of the present description, the center 118a of the target 118 is laterally displaced a distance L from the center 130a of the substrate 130. As explained in greater detail below, providing a relatively large lateral distance between the magnet poles 114a, 114b and the target 118 on the one hand, and the substrate 130 on the other hand, can, it is believed, also contribute to a reduction or elimination of plasma induced damage to a film on the substrate 130.

The support systems 160 comprise various apparatuses that, collectively, facilitate functioning of the PVD chamber 100. Illustratively, the support systems 160 include one or more sputtering power supplies, one or more vacuum pumps, sources of a sputtering gas and/or gas mixture, control instruments and sensors, and the like known to those skilled in the art.

The controller 180 comprises a central processing unit (CPU), a memory, and support circuits (none is shown). Via an interface 182, the controller 180 is coupled to and controls components of the PVD chamber 100, as well as deposition processes performed in the chamber.

In accordance with yet another aspect of the present description, a power supply of the support system 160 coupled to the target 118 can provide a biasing voltage applied to the target 118 at a relatively low power. As explained in greater detail below, such reduced power can, it is believed, also contribute to a reduction or elimination of plasma induced damage to a film on a substrate 130.

In accordance with still another aspect of the present description, a pump and gas supplies of the support system 160 can provide an intermediate chamber pressure during the sputtering process. As explained in greater detail below, such intermediate process pressure can, it is believed, also contribute to a reduction or elimination of plasma induced damage to a film on a substrate 130.

In one embodiment, the main assembly 104 includes a chamber body 128, the rotatable substrate pedestal 126, an inverted shield 136 circumferentially attached to the body 128, and a plurality of radiant heaters 134. The shield 136 generally extends from the upper portion of the member body 128 downward and inward toward the pedestal 126. The substrate pedestal 126 includes a substrate platen 154 and a column module 150 that are coupled to one another. Vacuum-tight coupling between the lid assembly 102 and the main assembly 104 is illustratively provided by at least one seal, of which an o-ring 132 is shown. The radiant heaters 134 (e.g., infrared (IR) lamps, and the like) are generally used to pre-heat the internal parts of the chamber 100 to a temperature determined by a specific process recipe for preconditioning of the chamber (for example, chamber bake out). As the radiant heaters 134 are positioned below the shield 136, the heaters 134 are protected from deposition of the sputtered target material that may adversely affect heater performance.

A substrate 130 (e.g., silicon (Si) wafer, and the like) is introduced into and removed from the PVD chamber 100 through a slit valve 124 in the chamber body 128. The substrate may be cooled by water or heated by resistive elements incorporated inside the substrate holder.

In operation, the platen 154 may be selectively disposed in an upper processing position (as shown) or in a lower transfer position (shown in phantom). During wafer processing (i.e., sputter deposition), the platen 154 is raised to the upper position located at a pre-determined height H from the target 118. To receive or release the substrates 130, the platen 154 is moved to the lower position substantially aligned with the slit valve 124 to facilitate robotic transfer of the substrate.

Referring to the embodiment depicted in FIGS. 3A-B, the platen 154 includes at least one polymer member disposed in an upper substrate supporting surface 306 of the platen 154. The polymer member may be a suitable plastic or elastomer. In one embodiment, the polymer member is an o-ring 302 disposed in a groove 304. In operation, friction between the substrate 130 and the o-ring 302 prevents the wafer from slipping along a substrate supporting surface 186 of the rotating platen 154. Three O-rings 302 are shown in the top view of the pedestal 126 of FIG. 3B spaced between lift pin holes 316. Alternatively, a single o-ring 302 as shown in FIG. 3A may be disposed along the perimeter of the supporting surface 306 to prevent the substrate from slipping as the substrate rotates during processing.

The platen 154 additionally includes an annular peripheral rim 308 extending upward from the surface 306 and an annular peripheral and upwardly facing trench 310. The rim 308 defines a substrate receiving pocket 312 in the surface 306 that provides additional protection from substrate slippage at higher angular velocities of the platen 154. In a further embodiment (not shown), the rim 308 may be chamfered, angled, rounded or otherwise adapted to guide the substrate 130 for positioning with a minimal offset from a center of the platen 154.

In one embodiment, in the upper position of the substrate pedestal 126, the peripheral trench 310 interleaves with a downwardly extending inner lip 314 of the inverted shield 136, thus forming a trap for a peripheral flux of the sputtered target material. Such a trap protects the radiant heaters 134 from sputter deposition and extends operational life of the heaters (e.g., IR lamps). The trench 310 includes a bottom member 360 and an upwardly extending finger 362. The bottom member 360 and finger 362 may optionally be coupled to the platen 154 as a replaceable member 364 (as shown in phantom).

In alternate embodiments (not shown), the platen 154 may comprise a clamp ring, an electrostatic chuck, embedded substrate heaters, passages for backside (i.e., heat exchange) gas and/or cooling fluid, radio-frequency electrodes, and other means known to enhance a PVD process. Coupling to the respective sources (not shown) of the backside gas, cooling fluid, and electric and radio-frequency power may be accomplished using a conventional means known to those skilled in the art.

Returning to FIG. 1, the motion control unit 170 generally includes bellows 148, a magnetic drive 144, a displacement drive 140, and a lift pins mechanism 138 that are illustratively mounted on a bracket 152 attached to the chamber body 128. The bellows 148 provide an extendable vacuum-tight seal for the column module 150 that is rotatably coupled (illustrated with an arrow 156) to a bottom plate 192 of the bellows. A vacuum-tight interface between the bracket 152 and the chamber body 128 may be formed using, e.g., one or more o-rings or a crushable copper seal (not shown).

The column module 150 includes a shaft 198 and a plurality of magnetic elements 142 disposed proximate to the magnetic drive 144. In operation, the magnetic drive 144 includes a plurality of stators that may be selectively energized to magnetically rotate the magnetic elements 142, thereby rotating column module 150 and the platen 154. In one exemplary embodiment, the angular velocity of the substrate pedestal 126 is selectively controlled in a range of about 10 to 100 revolutions per minute. It is contemplated that the magnetic drive may be replaced by other motors or drives suitable for rotating the pedestal.

In operation, the flux of the material sputtered from the target 118 may be spatially non-uniform because of variations in the material composition of the target, accumulation of contaminants (e.g., oxides, nitrides, and the like) on the target, mechanical misalignments in the lid assembly 102, and other factors. During film deposition in the PVD chamber 100, the rotational motion of the substrate pedestal 126 can compensate for such spatial non-uniformity of the flux of the sputtered material and deposit, on the rotating substrate 130, highly uniform films. For example, variation in sputtered material from different regions of the target 118 may be averaged across substrate 130 as it rotates, thus resulting in high thickness uniformity of the deposited films. In the illustrated embodiment, it is believed that a thickness uniformity of less than 0.8% (1 sigma) may be achieved. It is appreciated that in other applications, other degrees of thickness uniformity may be achieved. It is further appreciated that in other applications, other features of the rotating pedestal 126 and the tilted target 118 may be utilized.

The displacement drive 140 is rigidly coupled to the bottom plate 192 of the bellows 148 and, in operation, facilitates moving (illustrated with an arrow 184) the substrate pedestal 126 between the lower (i.e., wafer receiving/releasing) position and the upper (i.e., sputtering) position. The displacement drive 140 may be a pneumatic cylinder, hydraulic cylinder, motor, linear actuation or other device suitable for controlling the elevation of the pedestal 126.

As previously mentioned, the magnetron pack 114 includes relatively strong and relatively well balanced magnet poles 114a, 114b. It is believed that a strong magnet tends to reduce sputtering voltage and therefore reduce the acceleration of the ions, such as argon ions, for example, impacting the target surface 220. As a result, the average energy of the sputtered atoms or molecules may be reduced. It is also believed that a relatively well balanced magnet or a unbalanced magnet with a strong central magnetic pole tends to reduce the electron and ion fluxes at the substrate and induces low self-bias potentials (also known as floating potentials). It is believed that such reductions in the energy of the sputtered material, the fluxes of electrons and ions, and the self-bias potentials, can reduce damage to a thin film or other structure on a substrate 130.

In the illustrated embodiment, the poles 114a, 114b of the magnetron pack 114 produce a magnetic field having a field strength of at least 150 gauss measured in a direction parallel to a surface 115 of the poles facing the target 118 at a distance of about one inch from the surface 115 of the poles 114a, 114b. Examples of suitable field strengths parallel to the surface 115 include 310, 330 and 660 gauss, for example. Also in the illustrated embodiment, each pole 114a, 114b of the magnetron pack 114 produces a magnetic field having a field strength of at least 80 gauss measured in a direction normal to the surface 115 of the associated pole at a distance of about one inch from the surface 115 of the associated pole. Examples of suitable field strengths normal to the surface 115 of the associated pole include 130, 160 and 360 gauss, for a north pole 114a, for example. Additional examples of suitable field strengths normal to the surface 115 of the associated pole include 350, 400 and 900 gauss, for a south pole 114b, for example. It is appreciated that other magnet strengths may be suitable, depending upon the particular application.

It is believed that magnetron rotation can, in general, exacerbate non-uniform voltage distribution effects on the surface of the substrate. A non-uniform voltage distribution on a substrate surface can result in charging damage to thin films or other structures on the substrate. However, it is further believed that a well balanced magnetron can confine electrons to areas close to the target which is believed to enhance protection of thin films or other structures on the substrate 130. In addition, it is believed that a well balanced magnetron has relatively little residual magnetic field on the surface of the substrate 130 which is believed to reduce voltage fluctuations on the substrate surface.

In the illustrated embodiment, the magnetic strength of the center pole 114a is at least that of the outer poles 114b. Thus, in one embodiment, the magnetic strength of the center pole 114a substantially matches that of the outer poles 114b. Examples of suitable balanced magnetron packs include magnetrons for which the maximum unbalance of the poles is within 0.3 or 0.1. Other suitable magnetrons include an unbalanced magnetron for which the magnetic strength of the center pole 114a is greater than that of the outer poles 114b. It is appreciated that other magnet balances or imbalances may be suitable, depending upon the particular application.

It is further believed that a relatively large offset, both vertical and lateral, between the magnetron pack 114 and the substrate 130, together with a well balanced magnetron pack 114, can also facilitate reduction or elimination of non-uniform voltage distribution on the surface of the substrate 130.

In addition to reducing charging damage, it is believed that a well balanced magnetron and large vertical and lateral offsets between the magnetron pack 114 and the substrate 130 can reduce the magnitude of the floating voltage on the substrate which can reduce the acceleration of ions in the plasma sheath region toward the substrate, thereby, it is believed, reducing or eliminating damage to thin films or other structures on the substrate. It is also believed that a relatively well balanced magnet or an unbalanced magnet with a strong central magnetic pole tends to reduce the electron and ion fluxes at the substrate, which can further reduce damage to a thin film or other structure on a substrate 130.

Figure 2:
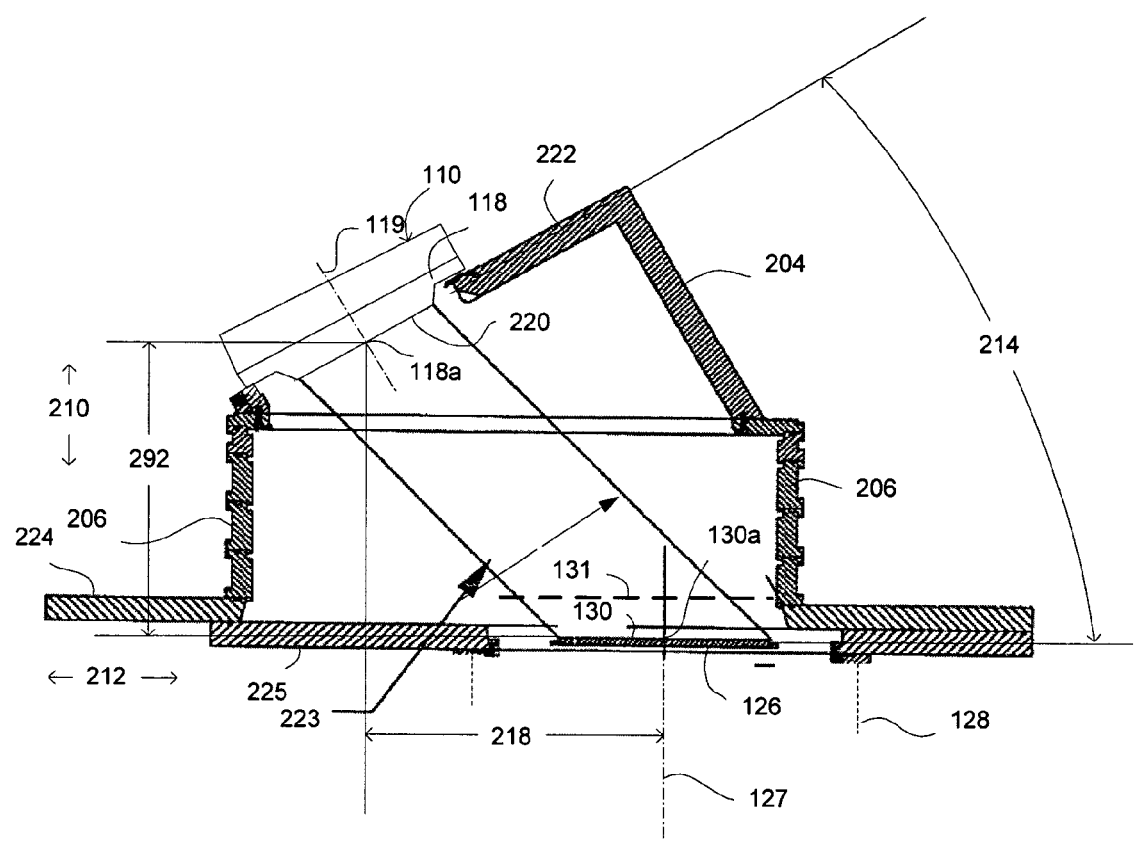
FIG. 2 is a schematic sectional view of another embodiment of a PVD chamber in accordance with the present description.

FIG. 2 depicts a schematic cross-sectional view of another embodiment of a PVD chamber lid assembly 202 having a sputtering target 118 disposed at an angle to and laterally offset from an axis of rotation of the pedestal. The image of FIG. 2 is simplified for illustrative purposes and is not depicted to scale.

The lid assembly 202 generally comprises the target assembly 110, a tilted upper enclosure 204, and, optionally, at least one spacer 206 (one spacer is shown) mounted between the enclosure 204 and the chamber body 128. Illustratively, vacuum-tight coupling between the lid assembly 202, spacers 206, and the main assembly 104 may be provided by using one or more scales or other suitable fasteners.

The target assembly 110 is mounted in the upper enclosure 204 in a tilted position such that an angle 214 is formed between a sputtering surface 220 of the target 118 and the supporting surface 186 of the rotatable substrate pedestal 126 (or substrate 130). The center 118a of sputtering surface 220 is vertically spaced a distance 292 from the substrate 130. The center 118a of the sputtering surface 220 may additionally be laterally spaced a distance 218 from the center 130a of the substrate 130. For example, the distance 218 may be selectively set between about zero to about 450 mm. It is believed that in applications in which protection of thin films is to be enhanced, a lateral offset within a range of 300-400 mm, such as 350 mm, for example, may be appropriate. In further embodiment, the lid assembly 202 has a sliding plate 224 which slides along a fixed plate 225 of the main assembly 104 (illustrated with an arrow 212) to adjust the lateral offset between the target 118 and the substrate 130 to enhance deposition performance.

A top panel 222 of the upper enclosure 204 is generally oriented, such that the angle 214 may be selected in a range from about 15 to about 50 degrees. The tilted target can cause sputtered material of the flux 223 to impact the substrate at an inclined (i.e., non-perpendicular) incidence, which is believed to improve conformal deposition. As the pedestal rotates during deposition, deposition material is deposited on the substrate surface through 360 degrees. It is appreciated that other angles may be suitable, depending upon the particular application. The optimum angle 214 may be determined for each type of target material and/or substrate surface topography, for example, through pre-production testing. Once optimum angles 214 are determined, the lid assembly 202 (and target 118) may be inclined at an appropriate angle for each deposition process run.

The spacers 206 may be used to define the optimal vertical distance (illustrated with an arrow 210) between the target 118 and the substrate 130. In one embodiment, a combined height of the optional spacer(s) 206 may selected in a range from greater than about 0 to 500 mm. This allows a distance 292 spacing the center of the target 118 and the substrate 130 to be selected between about 200 to about 450 mm when the substrate pedestal 154 is in the raised, processing position. Similarly to the angle of target inclination, the spacers 206 may be adjusted to determine the optimal spacing between the substrate and target to achieve best processing results for different target materials and/or substrate topographies. Once the optimum distances are determined, the appropriate number and slack height of the spacers 206 may be utilized to produce optimum deposition results for each process run. It is believed that in applications in which protection of thin films is to be enhanced, a vertical offset within a range of 300-400 mm, such as 350 mm, for example, may be appropriate. It is appreciated that other vertical and lateral offsets may be suitable, depending upon the particular application.

Generally, optimal values of the angle 214, height 216 (spacing 292), and offset 218 that collectively define, with respect to the rotatable substrate pedestal 126, a spatial position of the target assembly 110 and, as such, an angle of incidence and kinetic energy of atoms the sputtered target material, may be process-specific. In operation, when the target assembly 110 is located in the process-specific optimal spatial position, films having the best properties (e.g., minimal thickness non-uniformity) may be deposited on the substrate 130. Thus, once the optimum angle, spacing and offset are known for predetermined deposition materials and/or substrate topographies the orientation of the lid assembly 202 and target 118 may be set in a predefined orientation to produce a desired process result for a predetermined process run.

As previously mentioned, a power supply of the support system 160 coupled to the target 118 can provide a biasing voltage applied to the target 118 at a relatively low power. It is believed that such a low biasing power can facilitate a relatively low sputtering voltage which can in turn lower the average energy of the sputtered atoms or molecules. Thus, it is believed that such reduced power can contribute to a reduction or elimination of plasma induced damage to a film on a substrate 130. In the illustrated embodiment, the controller 180 is adapted to control the power of a signal biasing the target 180 within a power range of 50 to 500 watts. It is appreciated that other power ranges may be suitable, depending upon the particular application.

As previously mentioned, a pump and gas supplies of the support system 160 can provide an intermediate chamber pressure during the sputtering process. In the illustrated embodiment, the controller 180 may be adapted to control the pressure within the chamber within a range of 1 to 7 milliTorr. It is believed that such an intermediate pressure can reduce the energy of the sputtered atoms or molecules, to contribute to a reduction or elimination damage to a film or other structure on a substrate 130. It is appreciated that other pressure ranges may be suitable, depending upon the particular application.

An optional shutter disk 131 (schematically represented by a dashed line), can be used to shield the substrate 130 from plasma spikes in the initial plasma ignition and stabilization stage. The shutter disk 131 may then be moved to a storage area in order to expose the whole substrate 130 to the plasma and film deposition. In this manner, exposure of the substrate to the plasma for film deposition may be limited to the period in which plasma has stabilized.

Figure 4A:
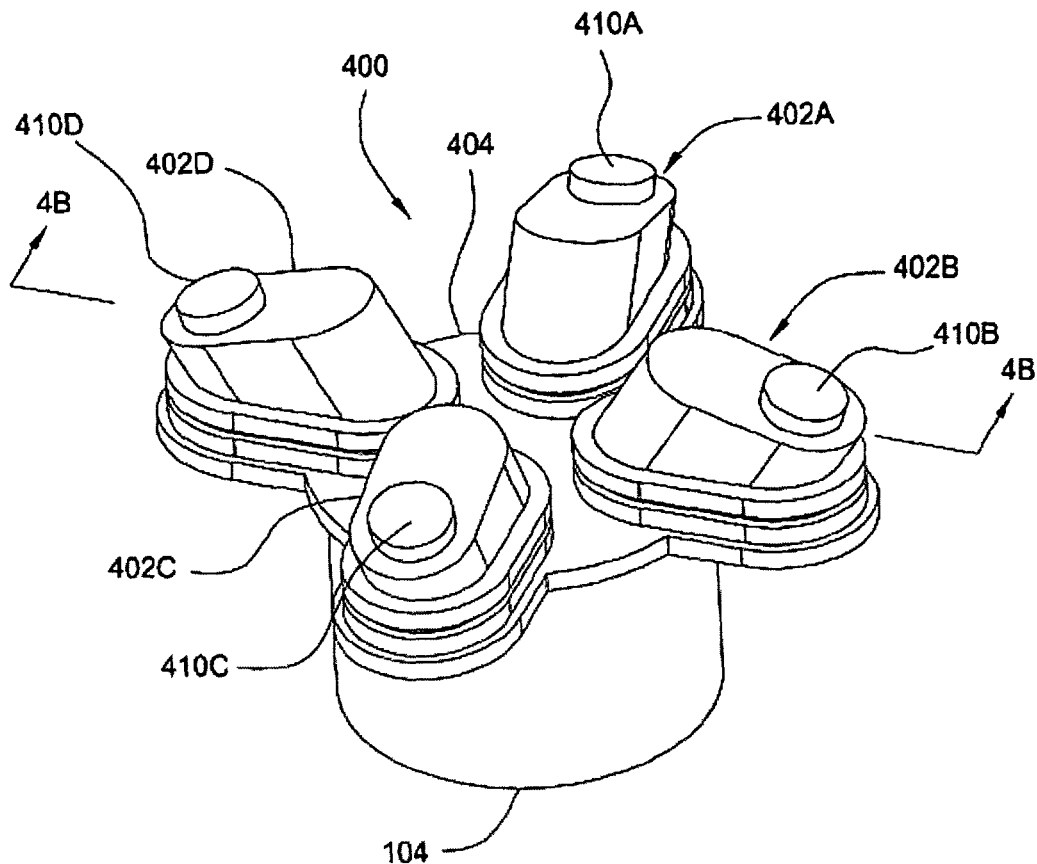
FIG. 4 is a schematic perspective view of another PVD chamber having a plurality of laterally offset sputtering targets disposed around a rotatable substrate pedestal.
Figure 4B:
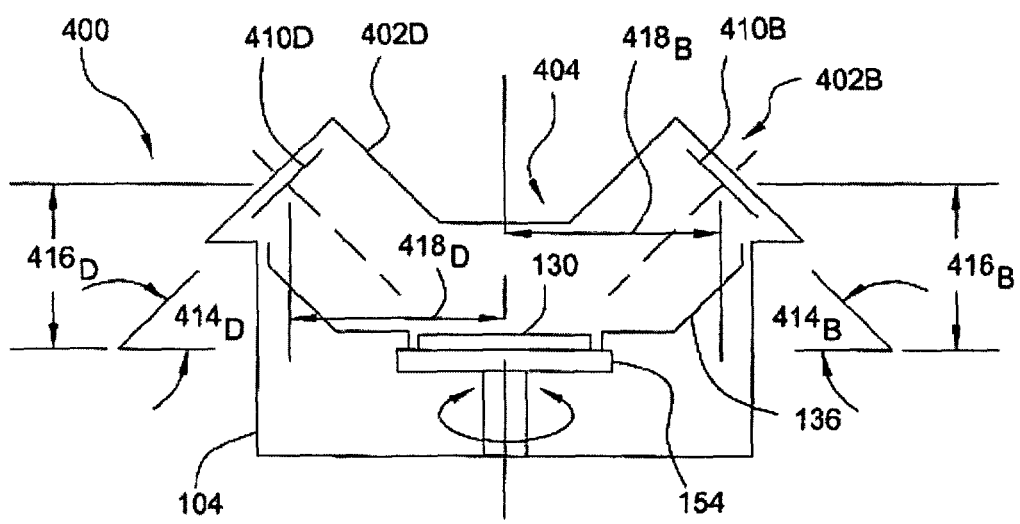

FIGS. 4A-B depict a schematic perspective and sectional views of another PVD chamber 400 comprising a plurality of the lid assemblies (four assemblies 402A-402D are illustratively shown) in accordance with yet another embodiment of the present invention. The image of FIG. 4A is simplified for illustrative purposes and is not depicted to scale. The lid assemblies 402A-D are similar to the lid assembly 202 described above. As such, the reader should refer simultaneously to FIGS. 2 and 4A-B.

Components that are substantially common to the PVD chambers 200 and 400 have been discussed above in reference to FIGS. 1-2. In the PVD chamber 400, the lid assemblies 402A-D are disposed around the rotatable substrate pedestal 126 (shown in FIG. 4B) of the main assembly 104 upon a common flange 404. The common flange 404 is in vacuum-tight contacts with the lid assemblies 402A-D and the main assembly 104. In one embodiment, with respect to the substrate pedestal 126, the lid assemblies 402A-D are disposed on the flange 404 substantially symmetrically. In a further embodiment, spatial positions of each target assembly 410A-410D may be selectively optimized by adjustment of the respective lid assembly 402A-B, as discussed above in reference to the lid assembly 202 and target assembly 110 of FIG. 2.

The PVD chamber 400 allows further optimization of properties of the deposited films (e.g., achieving minimal thickness non-uniformity), as well as facilitates in-situ fabrication of complex film structures (e.g., magnetic random access memory (MRAM) structures, metal gate electrode stacks, metal-oxide-metal capacitors, and the like). For example, the PVD chamber 400 where the target assemblies 410A-410D comprise targets 118 formed from different materials may be used to deposit in-situ multi-layered film stacks of highly uniform films of such materials or their mixtures. Moreover, as spatial positions (i.e., angles $414_{A-B}$, heights $416_{A-B}$, and offsets $418_{A-B}$) of each target assembly 410A-D in the apparatus 400 may be individually optimized relative to the rotating substrate pedestal 126 (i.e., angles $414_{A-B}$ may not necessarily be equal, with the same for heights $416_{A-B}$, and offsets $418_{A-B}$), different materials and film stacks may be in-situ deposited with minimal non-uniformity of the film thickness.

Copending U.S. application Ser. No. 11/260,899, filed concurrently herewith, and entitled "Thin Film Deposition" and assigned to the assignee of the present application and incorporated by reference in its entirety, is directed a system capable of producing layers of various materials stacked on one another on a substrate without exposing the substrate to the pressure and contaminants of ambient air until the stack is complete. The stack of layers can include both insulative layers such as a layer of silicon dioxide or hafnium oxide, for example, and conductive metal layers such as a layer of tantalum nitride or ruthenium tantalum alloy, for example. Such stacks may have a variety of applications including use as a gate stack of a MOS transistor, for example. The PVD chambers of the present application may be used in such a system to deposit a metal conductive layer or to deposit a dielectric layer, or both in a stack.

For insulation layer deposition, the PVD chamber has a target of suitable material such as silicon or hafnium silicide (HfSi), for example. In addition, various working and deposition gasses may be admitted into the chamber during the deposition process. For example, oxygen may be admitted during the sputtering of a HfSi target to produce a suitable dielectric film or layer of HfSiOx on the substrate 130. For some applications an insulation layer having a high K property is appropriate. It is appreciated that other types of insulation films may be deposited, depending upon the particular application. Additional examples of suitable metal gate dielectrics include tantalum oxide (TaOx), hafnium oxide (HfOx), etc.

The insulation layer may be deposited to a thickness below 10 nanometers (100 angstroms), for example. The deposition layer may be deposited in a single film or in a plurality of insulative films built-up, one upon another. Other thicknesses may be used, depending upon the particular application.

For depositing a conductive metal layer, such as a metal gate electrode layer, the material or materials of the metal gate electrode layers may be selected from a variety of conductive metals including tantalum, tantalum nitride, TaxRuy, TaSixNy, hafnium, hafnium nitride, tungsten, tungsten nitride, ruthenium, ruthenium oxide, platinum, titanium, titanium nitride, etc. The thicknesses of the films or layers may also vary, depending upon the particular application. In the illustrated embodiment a thin protective metal gate electrode layer has a thickness in a range of 5-30 angstroms, for example, and the bulk metal gate electrode layer has a thickness in a range of 30-600 angstroms, for example. It is appreciated that the thicknesses may vary, depending upon the particular application.

A gas source of the support system 160 supplies a sputtering working gas, such as, for example, the chemically inactive noble gas argon, to the chamber. The sputtering working gas can be neon, argon, krypton, xenon, or a mixture of two or more gasses from the aforementioned gasses, depending on the target materials, substrate materials, and applications. It is believed that certain combinations of the sputtering gas, the substrate material, and the sputtered material may further reduce the damage to the substrate. A reactive PVD system may utilize nitrogen from a source 398 to form a nitride such as tantalum nitride or titanium nitride to be deposited as a film on the substrate. Another reactive PVD system may utilize oxygen from a source to form an oxide film for deposition. Examples of such an oxide film include silicon dioxide or hafnium silicon oxide films. Methane is useful for forming a carbide film such as tantalum carbide or tantalum carbide nitride. Other working gasses and reaction gasses may be provided as well.

For those PVD chambers which may utilize gasses such as toxic gasses or other gasses having additional handling protocols, the support systems 160 may include a combination pump which includes a cryogenic pump and a turbomolecular pump. In the illustrated embodiment, the cryogenic pump has a single stage adapted to absorb water vapor for example, but lacks a second stage which would typically absorb additional gasses such as oxygen or methane. Absorption of certain gasses may not be in accordance with the handling protocols for those particular gasses. Rather than absorbing the gasses in a second stage of cryogenic pump, these additional gasses may be pumped away by the turbomolecular pump. It is appreciated that the combination pump may be used to achieve an appropriate vacuum and is flexible enough to pump a variety of gases and vapors including, for example, O2, N2, Ar, CH4, H2, etc. For example, the PVD chamber may be used to deposit dielectric films as well as conductive metal films.

The foregoing description of various embodiments has been presented for the purposes of illustration. It is not intended to be exhaustive or to limit to the precise form disclosed. Many modifications and variations are possible in light of the above teaching.

We claim:

1. A method for physical vapor deposition, comprising:
forming a gate of a transistor on a semiconductor wafer substrate, said forming including:
rotating a magnetron adjacent a target;
rotating said semiconductor wafer substrate in a chamber body;
sputtering a surface of the target to deposit target material on said substrate in a layer of said gate wherein said gate layer has a thickness less than 100 angstroms; and
inhibiting plasma damage to underlying material of said gate while depositing said layer, said inhibiting including laterally offsetting the center of the target sputtering surface with respect to the center of the substrate within a range of 300 to 400 mm, and controlling the pressure within said chamber within a range of 1 to 7 milliTorr.

2. The method of claim 1, wherein said inhibiting includes controlling the power of a signal biasing said target within a power range of 50 to 6000 watts.

3. The method of claim 1, wherein said inhibiting includes disposing the target at an angle between about 15 to about 50 degrees.

4. The method of claim 1, wherein said inhibiting includes vertically offsetting said target sputtering surface center with respect to said substrate center within a range of 300 to 400 mm.

5. The method of claim 1 wherein said inhibiting includes matching the magnetic strength of a center pole substantially to that of outer poles of the magnetron.

6. The method of claim 5 wherein the maximum unbalance of the poles is within 0.9.

7. The method of claim 1 wherein said inhibiting includes each pole of the magnetron producing a magnetic field having a field strength of at least 150 gauss measured in a direction parallel to the surface of the associated pole at a distance of about one inch from the surface of the associated pole.

8. The method of claim 1 wherein said inhibiting includes each pole of the magnetron producing a magnetic field having a field strength of at least 80 gauss measured in a direction normal to the surface of the associated pole at a distance of about one inch from the surface of the associated pole.

9. The method of claim 1 wherein said sputtering includes sputtering a surface of the target to deposit a conductive target material in a conductive gate electrode layer having a thickness in a range of 5-30 angstroms and wherein said inhibiting includes inhibiting plasma damage to an underlying gate insulative layer of insulative material of said gate while depositing said conductive gate electrode layer of said gate wherein said gate insulative layer has a thickness less than 100 angstroms.

* * * * *